ated chamber (52). An electron saturated magnetic field
United States Patent [19]

White

[11] 4,420,386

[45] Dec. 13, 1983

[54] METHOD FOR PURE ION PLATING USING MAGNETIC FIELDS

[75] Inventor: Gerald W. White, Dallas, Tex.

[73] Assignee: White Engineering Corporation, Dallas, Tex.

[21] Appl. No.: 487,748

[22] Filed: Apr. 22, 1983

[51] Int. Cl.³ .............................................. C23C 15/00
[52] U.S. Cl. ........................... 204/192 N; 204/192 R; 204/298; 427/39; 427/50
[58] Field of Search ...................... 204/192 N, 192 R; 427/39, 50

[56] References Cited

U.S. PATENT DOCUMENTS

| Re. 30,401 | 9/1980 | White ............................ 204/192 N |
| 3,329,601 | 7/1967 | Mattox ............................ 204/298 |
| 3,913,520 | 10/1975 | Berg et al. ............................ 118/7 |
| 3,974,059 | 8/1976 | Murayama ........................ 204/298 |
| 4,016,389 | 4/1977 | White ............................ 219/10.49 |
| 4,039,416 | 8/1977 | White ............................ 204/192 N |
| 4,094,764 | 6/1978 | Boucher et al. ................ 204/192 N |
| 4,107,350 | 8/1978 | Berg et al. ............................ 427/38 |
| 4,116,791 | 9/1978 | Zega ................................ 204/192 N |
| 4,210,701 | 7/1980 | Berg et al. ............................ 428/409 |
| 4,342,631 | 8/1982 | White et al. .................... 204/192 N |

OTHER PUBLICATIONS

"A Study of Vacuum Deposition Techniques", White, Gerald W. *Appliance Engineer*, Apr. 1981, 51–54.

*Primary Examiner*—Arthur P. Demers
*Attorney, Agent, or Firm*—Richards, Harris & Medlock

[57] ABSTRACT

A method for ion plating a substrate (b 40) within a chamber (52) with a plating material (20) is provided. The method includes evacuating the chamber (52) and vaporizing the plating material (20) within the evacuated chamber (52). An electron saturated magnetic field (30) is placed adjacent the substrate (40) for positive ionization of the evaporant atoms of the vaporized plating material (20). A negative bias (61, 62) is applied to the substrate (40) for attracting positive ions of the vaporized plating material (20).

14 Claims, 4 Drawing Figures

METHOD FOR PURE ION PLATING USING MAGNETIC FIELDS

TECHNICAL FIELD

This invention relates to high energy level ion plating deposition of plating material, and more particularly to an ion plating method utilizing magnetic fields.

BACKGROUND ART

Vacuum technology has been used in a variety of applications to provide an efficient and high quality method for the deposition of coating materials onto a variety of substrates.

In the application of coatings to substrates, vacuum evaporation systems, sputtering, and ion plating have been used in the past with varying degrees of success. In the early days, vacuum systems deposited materials by simply evaporating the material and allowing it to condense on the surface of the substrate. Vacuum evaporation provides high deposition rates, but has the disadvantage of being a "line-of-sight" process. Further, since there is no particle acceleration involved in the vapor deposition, adhesion can frequently be a problem. The use of cathode bombardment in the sputtering techniques overcomes to some degree the "line-of-sight" problem, and offers a wide variety of materials and generally better adhesion than does vapor deposition.

An additional plating approach is shown in U.S. Pat. No. 3,329,601 issued to Mattox on July 4, 1967 and entitled "Apparatus for Coating a Cathodically Biased Substrate from Plasma of Ionized Coating Material" whereby ions of plating material are formed in an inert gas plasma and extracted electrostatically to arrive at the substrate at a very high potential energy level. The use of the Mattox method results in good adhesion of the deposited material; however, the Mattox process does not work well for plating insulators and resulted in argon contaminated films.

A still further ion plating method is described and shown in U.S. Pat. No. Re. 30,401 reissued to White on Sept. 9, 1980 and entitled "Gasless Ion Plating" which simultaneously biases the substrate with both DC and RF signals. The White method provides evaporant ionization and static attraction resulting in a system to plate both conductors and insulators with pure gas free films.

A need still exists for an ion plating process that will coat a wide variety of articles which are irregularly shaped with irregular depressions and which provides a smooth coating surface over such irregularities. A need further exists for an ion plating process whereby conductor materials such as, for example, gold, silver or copper, can be deposited on substrates such as, for example, ceramic substrates with such an intensity of energy that a level of adhesion is obtained that makes an adhesion layer of foreign material such as nickel or chromium unnecessary.

DISCLOSURE OF THE INVENTION

In accordance with the present invention, a method is provided for ion plating a substrate which substantially eliminates the problems heretofore associated with ion plating methods.

In accordance with the present invention, a method for ion plating a substrate within a chamber with a plating material is provided. The method includes evacuating the chamber and vaporizing the plating material within the evacuated chamber. An electron saturated magnetic field is placed adjacent the substrate for positive ionization of the evaporant atoms of the vaporized plating material. A direct current negative bias is applied to conductive substrates for attracting positive ions of the vaporized plating material and/or an RF bias is applied to substrates of insulating materials to thereby develop a negative self bias on the substrate surface to attract the positive ions of plating material.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION

Figure 1:
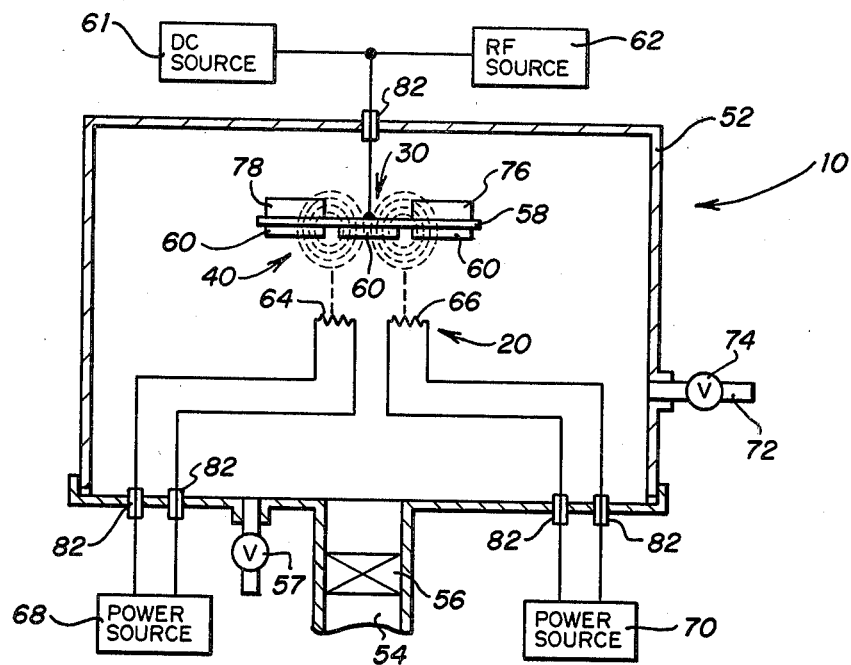
FIG. 1 is a schematic diagram illustrating structure for carrying out the method of the present invention.

A system for carrying out the present ion plating method is illustrated in FIG. 1 which illustrates a vacuum plating system, generally identified by the numeral 10. System 10 includes an evaporant source, generally identified by the numeral 20. The evaporant atoms are ionized by electron collison when passing through a magnetic field, generally identified by the numeral 30, to a substrate, generally identified by the numeral 40 for converting the material to be plated into substrate 40 into the plasma state in the area of substrate 40.

System 10 includes a chamber housing 52 suitable for providing a vacuum therein. Chamber housing 52 may be vertical or horizontal and may be comprised of any suitable material for maintaining vacuum pressure. Chamber housing 52 includes an outlet 54 controlled by a valve 56 which leads to a pump (not shown) for vacuum evacuation of chamber housing 52. System 10 may be brought back to atmospheric pressure by utilizing a valve 57.

A fixture 58 is provided in chamber housing 52 for holding one or more articles or substrate 40 to be coated. Substrate 40 may comprise, for example, a substrate intended for use as an electrical circuit component which is made of, for example, plastic, ceramic, ceramic coated metal or silicon materials. As illustrated in FIG. 1, substrate 40 comprises printed circuit boards 60. It being understood that the present method can be utilized for coating any type of articles and printed circuit boards 60 are utilized herein for illustrative purposes only.

A DC power source 61 and an RF power source 62 are provided and are connected to fixture 58 for attracting positive ions toward printed circuit boards 60 from a material vaporization source 20. Vaporization source 20 may be of any suitable source that may vaporize plating material, such as, for example, a refractory boat, an electron beam gun, an induction heated crucible, electric arc, or as illustrated in FIG. 1, one or more electric filaments 64 and 66 which are in turn connected to power sources 68 and 70, respectively. Plating material vaporized by source 20 may include, for example: gold, copper, silver or aluminum. Two such filaments 64 and 66 may be utilized for the deposition of different materials and deposition during different time periods.

A gas supply conduit 72 controlled by a metering valve 74 is connected to chamber housing 52 whereby input gas may be injected into chamber housing 52. The input gas may be inert or other gasses conducive to performing specific functions such as, for example, inert gas ion bombardment cleaning of printed circuit boards 60 prior to the plating process or collision scattering of the evaporant atoms to enhance uniformity of coating three dimensional objects. RF source 62 is provided for this latter purpose as RF sputtering generally cleans better than the cleaning action of a DC source.

Additionally, the input gas may be a metal bearing gas plasma for producing high metal penetration. If substrate heating is desired, input gas rich in hydrogen, such as ammonia, will deliver a high current flow as a result of the high ionization potential of hydrogen.

Fixture 58 includes magnets 76 and 78 which may comprise, for example, permanent magnets or electro magnets for establishing magnetic field 30 adjacent printed circuit boards 60. Evaporant atoms passing through the electrons that are spiraling in magnetic field 30 become ionized by collision with electrons and are immediately attracted to the high negative potential generated by the negative charge of DC power source 61. All connections made to the interior of chamber housing 52 are made through insulators 82.

In operation of the present method, the high energy level ion plating system 10 illustrated in FIG. 1 is evacuated through outlet 54 to a suitable vacuum, such as, for example, approximately $1 \times 10^{-4}$ millimeters of mercury. If it is desired to have a cleaning procedure for printed circuit boards 60 for chemical or physical reasons, gas may be introduced into chamber housing 52 through conduit 72, for example, at a pressure of ten to twenty microns and a radio frequency plasma formed by the gas will bombard the surface of printed circuit boards 60 advantageously to effectuate cleaning. After cleaning, the gas will be withdrawn from the evacuated chamber housing 52 prior to initiating the plating process.

A direct current negative bias, for example, 3 to 5 kilovolts from DC power source 61 may be applied to fixture 58 which acts as a cathode to attract positive ions towards printed circuit boards 60 by attraction through a high voltage drop where printed circuit boards 60 are conductive. Where printed circuit boards are insulators, RF source 62 provides the biasing source for the present method. Plating begins when one or both material electric filaments 64 or 66 are heated to a temperature high enough to vaporize the plating material. Where filaments 64 and 66 are resistance heated sources, a low voltage, high current alternating current power source 68 and 70 are utilized.

Magnets 76 and 78 provide magnetic field 30 to thermonic electrons from the evaporant 20 causing these electrons to spiral and thus offer a dense ionization cross section to atoms of evaporant material passing through the cloud on the way to printed circuit boards 60. Thus, ionization is at a maximum in the region of printed circuit boards 60 where the need is greatest. Either or both of the resistant electric filaments 64 or 66 may be utilized by varying the power input from power sources 68 and 70 to filaments 64 and 66, respectively, to plate one or more material films or layers onto printed circuit boards 60.

The "throwing power" or three dimensional coating capability of low plating processes results because ions of plating material are extracted uniformly from a plasma, accelerated a comparatively short distance across the Crooke's dark space, a region immediately and uniformly surrounding the negatively charged substrate, whereupon they arrive at the substrate from a diffuse rather than a point source. Previous methods have involved a chamber filled with plasma. It can be seen that it is only necessary for good results to have the plasma in the region immediate to the substrate so that the plasma can send ions into the "dark space" for subsequent plating of the substrate.

Figure 2:
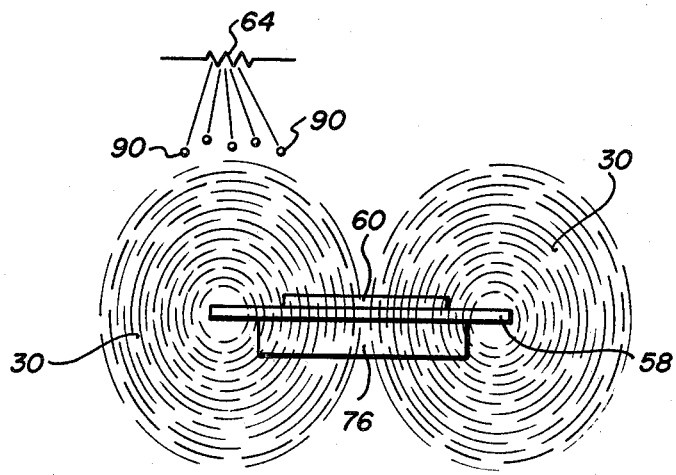
FIG. 2 is an enlarged diagram illustrating a substrate to be plated by the method of the present invention.

Referring now to FIG. 2, a more detailed illustration of the present plating method is shown wherein fixture 58 is electrically biased by sources 61 or 62 (FIG. 1). Fixture 58 supports a printed circuit board 60 in the presence of magnetic field 30 produced by magnet 76. Atoms 90 of evaporant material pass through magnetic field 30 on their way to printed circuit board 60 and are generated by the evaporant source such as, for example, electric filament 64 which may also comprise an emitter of thermionic electrons. The emitted electrons are caught and forced to spiral in magnetic field 30 where the electrons offer a large ionization cross section to evaporant atoms and in so doing convert these atoms to positive ions. The positive ions are immediately accelerated to the negatively charged cathode, fixture 58, arriving thereupon with high particulate energy. If printed circuit boards 60 are also insulators, the biasing source of RF source 62 should be utilized so that a self induced negative bias will occur on the surface of printed circuit board 60. The self-induced negative bias occurs because electrons are trapped on the negative half cycle of the RF cycle and cannot flow off during the positive half cycle.

Although FIG. 2 illustrates a printed circuit board 60 being separated from magnet 76 by fixture 58, it should also be understood that printed circuit boards 60 can also lie immediately adjacent magnet 76, such that fixture 58 supports both printed circuit boards 60 and magnet 76 on the same side of fixture 58.

Figure 3:
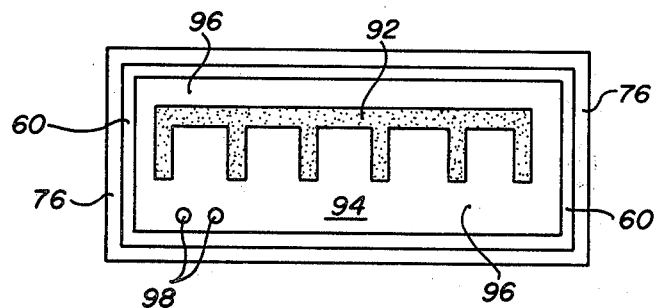
FIG. 3 is an enlarged view of a substrate representing a printed circuit board illustrating the method of the present invention.

Referring now to FIG. 3, wherein like numerals are utilized for like and corresponding components previously identified with respect to FIGS. 1 and 2, the present process is further illustrated for use in deposition of a pattern 92 for creating a printed circuit board 60. In FIG. 3, magnet 76 also functions as the electrically biased fixture (fixture 58 of FIGS. 1 and 2). Printed circuit board 60 is secured in tight contact by a shadow mask 94 of KOVAR, steel or other magnetically attractive material to reveal pattern 92 on printed circuit board 60 that will be plated. The remaining portion 96 of printed circuit board 60 will remain unplated at the end of the deposition process.

The deposition process thereby deposits a pattern heretofore generated using etching chemicals. If printed circuit board 60 is not conductive, the electrical bias applied to magnet 76 is applied by RF source 62 (FIG. 1). The present method can also be utilized for through hole plating of holes 98 which pass through printed circuit board 60. The adhesion and electrical quality of these deposited films allow for subsequent plating by ordinary wet plating techniques to thicknesses of several mils.

Figure 4:
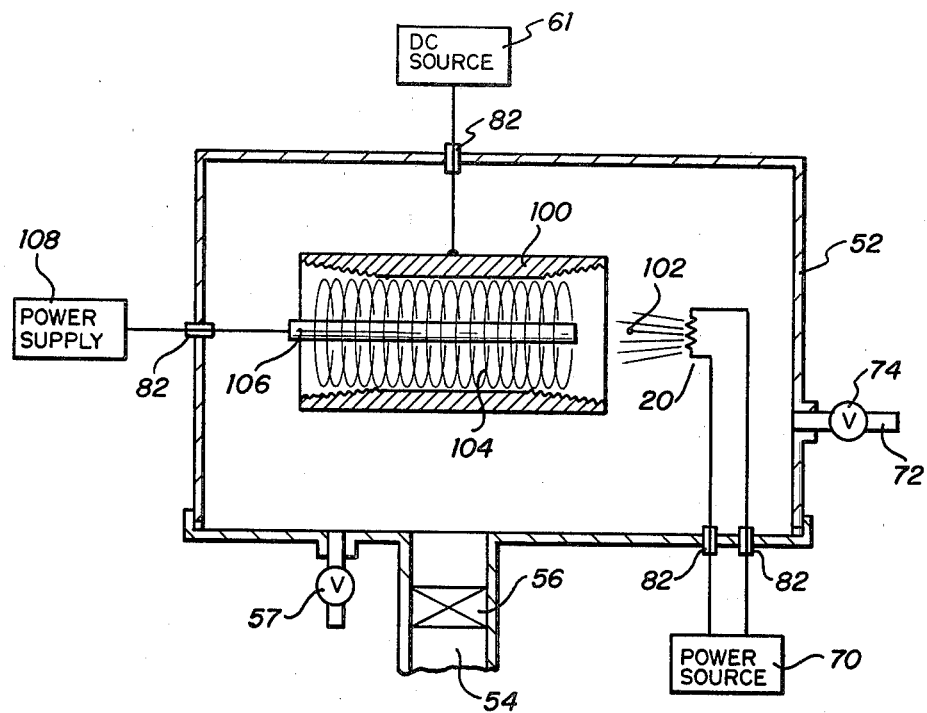
FIG. 4 is a schematic diagram illustrating structure for carrying out the method of the present invention.

Referring now to FIG. 4, further structure for carrying out the method of the present invention is illustrated. There are applications where it may not be practical to mount magnet 76 directly to a substrate 40 as illustrated in FIGS. 1 and 2. FIG. 4 illustrates the system of FIG. 1 wherein like numerals are utilized for like and corresponding components identified in FIG. 1 for ion plating of a substrate in which the magnet cannot be directly mounted thereto. FIG. 4 illustrates the use of the present method for plating the inside of a pipe coupling 100. Pipe coupling 100 is negatively biased by DC source 61. The evaporant source 20 directs atoms of evaporant 102 into a magnetic field 104 generated by magnet 106. To further assist in the acceleration of ions for adherent plating, a power supply 108 may be used to maintain a positive bias on magnet 106. The use of the positive bias on magnet 106 establishes a field gradient to direct positive ions 102 to pipe coupling 100.

It is noted that in the foregoing description of the process, no gas is required to be present for ionization. However, there are instances where the need for film uniformity over very irregular surfaces makes it desirable to add a slight amount of inert gas for the purpose of material scattering to further film uniformity. It should be noted that this use of an inert gas such as for example, argon at a pressure below the typical 10-20 micron pressure needed for ionization is low enough not to adversely affect film properties by inclusion of the gas in the deposited film.

It therefore can be seen that the present invention provides for an ion plating process that will coat a wide variety of articles which are irregularly shaped with irregular depressions to provide a smooth coating surface over such irregularities. The present method further can be utilized for deposition of plating material to create a printed circuit board previously generated through chemical etching procedures.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A method for ion plating a substrate within a chamber with a plating material comprising the steps of:
    evacuating said chamber;
    vaporizing plating material in the evacuated chamber;
    placing an electron saturated magnetic field adjacent the substrate for positive ionization of evaporant atoms of the vaporized plating material; and
    applying a negative bias on the substrate for attracting positive ions of the vaporized plating material.

2. The method of claim 1 wherein the magnetic field is provided by a permanent magnet.

3. The method of claim 1 wherein the magnetic field is provided by an electromagnet.

4. The method of claim 1 wherein the step of applying a negative bias on the substrate includes:
    applying a direct current negative bias on the substrate wherein the substrate is conductive material.

5. The method of claim 1 wherein the substrate is held by a fixture within the chamber and further including the step of:
    applying a radio frequency signal to the substrate fixture for generating a negative self bias on the surface of the substrate for attracting positive ions of the vaporized plating material wherein the substrate is nonconductive materials.

6. The method of claim 1 wherein the magnetic field attracts a deposition mask for securing the substrate during the plating process as well as generating a pattern on the substrate.

7. The method of claim 5 wherein the substrate comprises a printed circuit board.

8. The method of claim 6 and further including the step of plating holes contained within the printed circuit board.

9. The method of claim 1 and further including the step of applying a positive charge to in the area of the saturated magnetic field to direct the flow of positive ions.

10. The method of claim 1 wherein the substrate is ceramic material and the plating material is copper.

11. The method of claim 1 wherein the substrate is ceramic material and the plating material is gold.

12. The method of claim 1 wherein the substrate is ceramic material and the plating material is silver.

13. The method of claim 1 wherein the substrate is silicon material and the plating material is aluminum.

14. The method of claim 1 and further including the step of:
    injecting argon gas having a partial pressure of less than approximately 5 microns into the chamber.

* * * * *